United States Patent
Lin et al.

(10) Patent No.: US 11,959,956 B2
(45) Date of Patent: Apr. 16, 2024

(54) CIRCUIT CHECK METHOD AND ELECTRONIC APPARATUS

(71) Applicant: REALTEK SEMICONDUCTOR CORP., Hsinchu (TW)

(72) Inventors: Yun-Jing Lin, Hsinchu (TW); Meng-Jung Lee, Hsinchu (TW); Yu-Lan Lo, Hsinchu (TW); Shu-Yi Kao, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 681 days.

(21) Appl. No.: 17/125,034

(22) Filed: Dec. 17, 2020

(65) Prior Publication Data

US 2021/0190844 A1 Jun. 24, 2021

(30) Foreign Application Priority Data

Dec. 18, 2019 (TW) .................................. 108146532

(51) Int. Cl.
*G01R 31/00* (2006.01)

(52) U.S. Cl.
CPC .................................. *G01R 31/002* (2013.01)

(58) Field of Classification Search
None
See application file for complete search history.

(56) References Cited

U.S. PATENT DOCUMENTS

| 7,644,380 B1* | 1/2010 | Pandey | G06F 30/367 |
| | | | 716/136 |
| 2007/0078638 A1* | 4/2007 | McDonald | G06F 30/3323 |
| | | | 703/14 |
| 2018/0218100 A1* | 8/2018 | Srinivasan | G06F 30/367 |

FOREIGN PATENT DOCUMENTS

JP  2002149736 A  *  5/2002

OTHER PUBLICATIONS

Sedra et al., "Microelectronic Circuits Fifth Edition", Oxford University Press, 2004, p. 365, total 2 pages.

* cited by examiner

*Primary Examiner* — Daniel R Miller
(74) *Attorney, Agent, or Firm* — Birch, Stewart, Kolasch & Birch, LLP

(57) ABSTRACT

A circuit check method and an electronic apparatus applicable to a to-be-tested circuit are provided. The to-be-tested circuit has one or more first nodes related to a gate voltage of one or more transistor devices and a plurality of second nodes. The circuit check method includes: setting endpoint voltages of a plurality of input interface ports of the to-be-tested circuit; obtaining a first node voltage of the first node according to a conduction path of the to-be-tested circuit and the gate voltage of the transistor device; obtaining a second node voltage of each second node according to the conduction path, the endpoint voltages, and the first node voltage; and performing circuit static check on the to-be-tested circuit by applying the first node voltage and the second node voltage.

8 Claims, 4 Drawing Sheets

CIRCUIT CHECK METHOD AND ELECTRONIC APPARATUS

CROSS-REFERENCE TO RELATED APPLICATION

This non-provisional application claims priority under 35 U.S.C. § 119(a) to patent application Ser. No. 10/814,6532 in Taiwan, R.O.C. on Dec. 18, 2019, the entire contents of which are hereby incorporated by reference.

BACKGROUND

Technical Field

The present invention relates to a circuit check technology, and in particular, to a circuit check method and an electronic apparatus considering a gate voltage.

Related Art

In an analysis method for a static voltage designed for a circuit, if circuit simulation is not carried out, a DC path is generally taken as a transfer path to transfer a voltage source (power) and a ground voltage, a voltage of the voltage source and the ground voltage are taken as internal static voltages of circuit nodes, and the static voltages are applied to a subsequent circuit check item related to a node voltage and a device voltage.

A gate voltage is not considered during voltage transfer when the DC path includes a metal oxide semiconductor (MOS) device. Therefore, the static voltages obtained by analyzing voltage transfer of the DC path differ from an actual voltage value of the circuit during a conduction operation, which will lead to an inaccurate voltage applied to subsequent circuit check.

SUMMARY

In view of this, the present invention provides a circuit check method, which is applicable to a to-be-tested circuit. The to-be-tested circuit has at least one first node related to a gate voltage of at least one transistor device and a plurality of second nodes. The circuit check method includes: setting endpoint voltages of a plurality of input interface ports of the to-be-tested circuit; obtaining a first node voltage of the first node according to a conduction path of the to-be-tested circuit and the gate voltage of the transistor device; obtaining a second node voltage of each second node through analysis according to the conduction path, the endpoint voltages, and the first node voltage; and performing circuit static check on the to-be-tested circuit by applying the first node voltage and the second node voltage.

The present invention further provides an electronic apparatus, which is configured to check a to-be-tested circuit. The to-be-tested circuit has at least one first node related to a gate voltage of at least one transistor device and a plurality of second nodes, and the electronic apparatus performs the foregoing circuit check method on the to-be-tested circuit.

According to some embodiments, the first node voltage considers voltage transfer of a gate and a source of the transistor device, or considers voltage transfer of the gate and a drain.

According to some embodiments, the first node voltage considers voltage transfer of a gate, a source, and a threshold voltage of the transistor device, or considers voltage transfer of the gate, a drain, and the threshold voltage.

According to some embodiments, the first node voltage includes a first maximum value and a first minimum value of the first node. The second node voltage includes a second maximum value and a second minimum value of the second node.

According to some embodiments, when the transistor device is a MOS device, the MOS device is an N-type MOS (NMOS) device, a P-type MOS (PMOS) device, or any combination of the NMOS device and the PMOS device.

According to some embodiments, when the MOS device is the NMOS device and is turned on, a source voltage maximum value of the NMOS device is a smaller one in a gate voltage maximum value and a drain voltage maximum value, and is taken as the first maximum value. A drain voltage minimum value of the NMOS device is a source voltage minimum value, and is taken as the first minimum value.

According to some embodiments, when the MOS device is the PMOS device and is turned on, a drain voltage maximum value of the PMOS device is a source voltage maximum value, and is taken as the first maximum value. A source voltage of the PMOS device is a larger one in a gate voltage minimum value and a drain voltage minimum value, and is taken as the first minimum value.

According to some embodiments, when the MOS device is the NMOS device and is turned on, a source voltage maximum value of the NMOS device is a smaller one in a difference between a gate voltage maximum value and a threshold voltage and a drain voltage maximum value, and is taken as the first maximum value. A drain voltage minimum value of the NMOS device is a source voltage minimum value, and is taken as the first minimum value.

According to some embodiments, when the MOS device is the PMOS device and is turned on, a drain voltage maximum value of the PMOS device is a source voltage maximum value, and is taken as the first maximum value. A source voltage of the PMOS device is a larger one in a difference between a gate voltage minimum value and a threshold voltage and a drain voltage minimum value, and is taken as the first minimum value.

In conclusion, the gate voltage can be considered in the present invention to obtain node voltages for proper operation of the circuit, to find an abnormal device more accurately and avoid risk of misinformation (misjudgment) caused by erroneous voltage transfer.

DETAILED DESCRIPTION

A circuit check method and an electronic apparatus provided in the present invention are applicable to a to-be-tested circuit. The to-be-tested circuit has a plurality of nodes including at least one first node and a plurality of second nodes, the first node is related to a gate voltage of at least one transistor device, and the nodes at other locations are second nodes.

Figure 1:
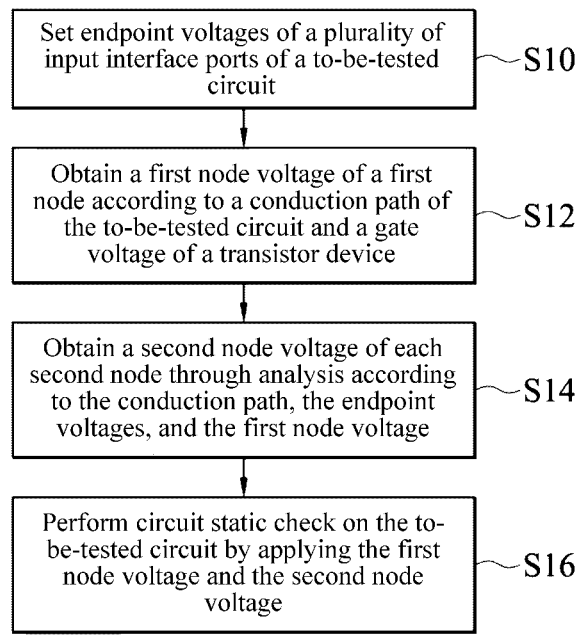
FIG. 1 is a schematic flowchart of an embodiment of a circuit check method according to the present invention.
Figure 2:
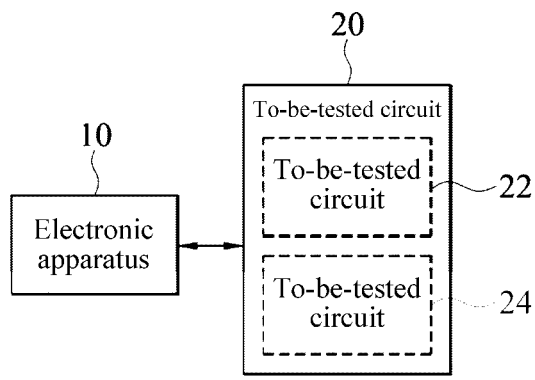
FIG. 2 is a schematic architectural diagram of an embodiment of an electronic apparatus according to the present invention.

FIG. 1 is a schematic flowchart of an embodiment of the circuit check method according to the present invention. FIG. 2 is a schematic architectural diagram of an embodiment of the electronic apparatus according to the present invention. Referring to FIG. 1 and FIG. 2, an electronic apparatus 10 is configured to check a to-be-tested circuit 20, and perform the circuit check method on the to-be-tested circuit 20. The circuit check method includes step S10 to step S16. First, as shown in step S10, endpoint voltages of a plurality of input interface ports of the to-be-tested circuit 20 are set. The endpoint voltages include a power voltage, a ground voltage, a gate voltage, and the like.

As shown in step S12, the electronic apparatus 10 obtains a first node voltage of a first node according to a conduction path of the to-be-tested circuit 20 and a related gate voltage of a transistor device. In an embodiment, the first node voltage includes a first maximum value and a first minimum value of the first node. As the first node voltage considers the gate voltage of the transistor device, the first node voltage has different embodiments. For example, the first node voltage considers voltage transfer of a gate and a source of the transistor device, or considers voltage transfer of the gate and a drain of the transistor device. Alternatively, a threshold voltage for turning on the transistor device is additionally considered. For example, the first node voltage considers voltage transfer of the gate, the source, and the threshold voltage of the transistor device, or considers voltage transfer of the gate, the drain, and the threshold voltage of the transistor device.

As shown in step S14, the electronic apparatus 10 obtains a second node voltage of each second node through analysis according to the conduction path, the endpoint voltages, and the first node voltage of the to-be-tested circuit 20. In an embodiment, the second node voltage includes a second maximum value and a second minimum value of the second node. Finally, as shown in step S16, in a circuit check item related to a node voltage and a device voltage, circuit static check is performed on the to-be-tested circuit 20 by applying the first node voltage and the second node voltage.

In an embodiment, the transistor device used in the to-be-tested circuit 20 may be a MOS device, and the MOS device is an NMOS device, a PMOS device, or any combination of the NMOS device and the PMOS device. The MOS devices are combined differently based on a circuit design of the to-be-tested circuit.

In an embodiment, the electronic apparatus 10 can be but is not limited to a notebook computer, a desktop computer, an industrial computer, or an electronic instrument on which a simulator or a software tool is installed.

Figure 3:
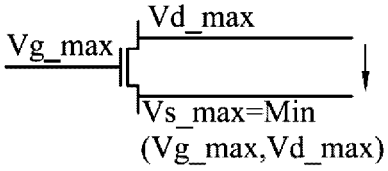
FIG. 3 is a schematic device diagram of an embodiment of calculating a first node voltage in a circuit check method according to the present invention.

Different MOS devices correspond to different calculation modes of the first node voltage. In an embodiment, FIG. 3 is a schematic device diagram of an embodiment of calculating the first node voltage in the circuit check method according to the present invention. Referring to FIG. 3, when the MOS device is the NMOS device and is turned on, a source voltage maximum value Vs_max of the NMOS device is a smaller one in a gate voltage maximum value Vg_max and a drain voltage maximum value Vd_max, represented as Vs_max=Min(Vg_max, Vd_max), and is taken as the first maximum value. A drain voltage minimum value Vd_min of the NMOS device is a source voltage minimum value Vs_min (Vd_min=Vs_min), and is taken as the first minimum value. When the MOS device is the PMOS device and is turned on, a drain voltage maximum value Vd_max of the PMOS device is a source voltage maximum value Vs_max, and is taken as the first maximum value. A source voltage minimum value Vs_min of the PMOS device is a larger one in a gate voltage minimum value Vg_min and a drain voltage minimum value Vd_min, represented as Vs_min=Max(Vg_min, Vd_min), and is taken as the first minimum value.

Figure 4:
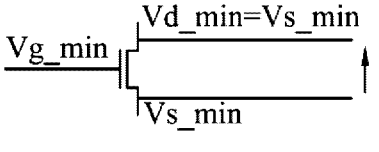
FIG. 4 is a schematic device diagram of another embodiment of calculating a first node voltage in a circuit check method according to the present invention.

In an embodiment additionally considering the threshold voltage, FIG. 4 is a schematic device diagram of another embodiment of calculating the first node voltage in the circuit check method according to the present invention. Referring to FIG. 4, when the MOS device is the NMOS device and is turned on, a source voltage maximum value Vs_max of the NMOS device is a smaller one in a difference between a gate voltage maximum value Vg_max and a threshold voltage Vnth and a drain voltage maximum value Vd_max, represented as Vs_max=Min(Vg_max−Vnth, Vd_max), and is taken as the first maximum value. A drain voltage minimum value Vd_min of the NMOS device is a source voltage minimum value Vs_min (Vd_min=Vs_min), and is taken as the first minimum value. When the MOS device is the PMOS device and is turned on, a drain voltage maximum value Vd_max of the PMOS device is a source voltage maximum value Vs_max, and is taken as the first maximum value. A source voltage minimum value Vs_min of the PMOS device is a larger one in a difference between a gate voltage minimum value Vg_min and a threshold voltage Vpth and a drain voltage minimum value Vd_min, represented as Vs_min=Max(Vg_min−Vpth, Vd_min), and is taken as the first minimum value.

To conveniently illustrate a detailed process of calculating the first node voltage through simulation, the following embodiments are illustrated by considering only the voltage transfer of the gate and the source, or the voltage transfer of the gate and the drain, without considering the threshold voltage, but the present invention is not limited thereto.

Figures 5, 6:
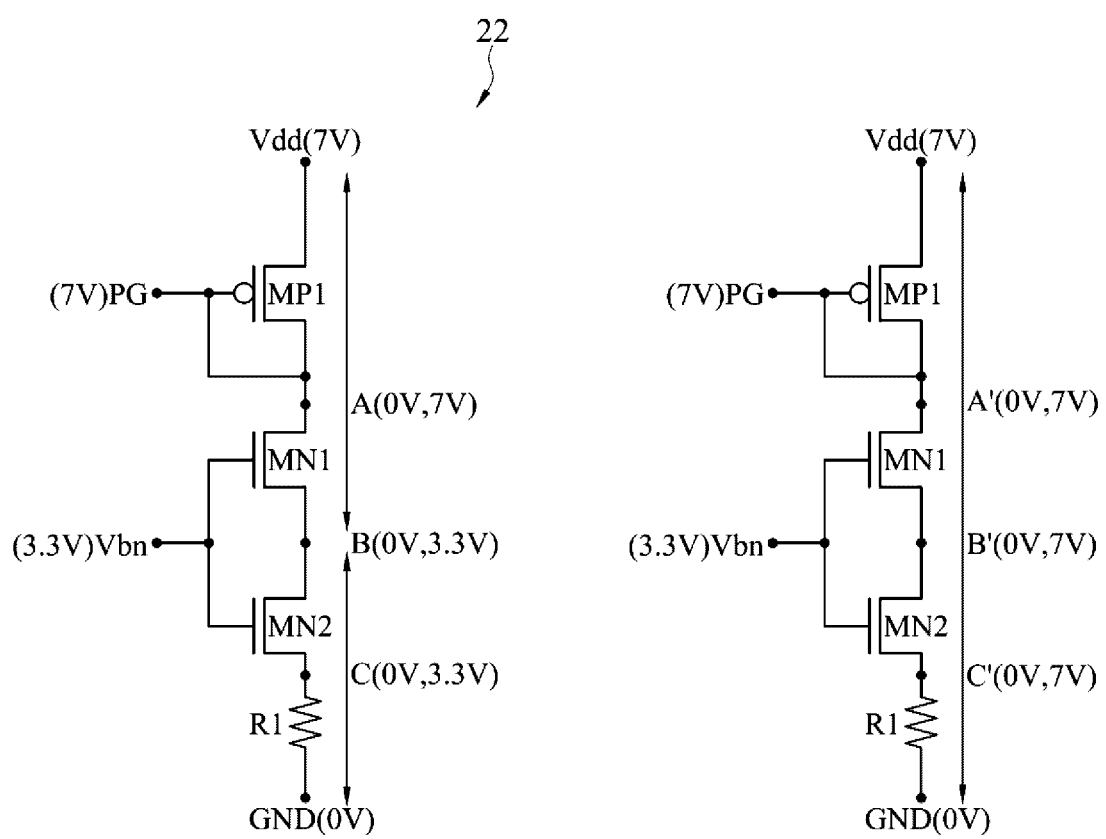
FIG. 5 is a schematic circuit diagram of an embodiment of a to-be-tested circuit to which the present invention is applied.
FIG. 6 is a schematic circuit diagram of an embodiment of a to-be-tested circuit without considering a gate voltage.

FIG. 5 is a schematic circuit diagram of an embodiment of a to-be-tested circuit to which the present invention is applied. Referring to FIG. 1 to FIG. 3 and FIG. 5, a to-be-tested circuit 22 includes three MOS devices: a first PMOS device MP1, a first NMOS device MN1, and a second NMOS device MN2, and a resistor device R1. A node A is present between the first PMOS device MP1 and the first NMOS device MN1, a node B is present between the first NMOS device MN1 and the second NMOS device MN2, and a node C is present between the second NMOS device MN2 and the resistor device R1. The node B is a first node, and the node A and the node C are second nodes.

When the electronic apparatus 10 performs the circuit check method on the to-be-tested circuit 22, the electronic apparatus 10 first sets endpoint voltages of input interface ports of the to-be-tested circuit 22: a power voltage Vdd is set to 7 V, a ground voltage GND is set to 0 V, a gate voltage PG is set to 7 V, and a common gate voltage Vbn is set to 3.3 V. The first NMOS device MN1 is a transistor device working at 7 V, and the second NMOS device MN2 is a transistor device working at 3.3 V. When the first PMOS device MP1, the first NMOS device MN1, and the second NMOS device MN2 are all turned on, a first node voltage of the node B as the first node is calculated first. The node B is located at a source end of the first NMOS device MN1, and a source voltage maximum value Vs_max of the first NMOS device MN1 is a smaller one in a gate voltage maximum value 3.3 V and a drain voltage maximum value 7 V, that is, 3.3 V is selected as a first maximum value of the node B. The node B is located at a drain end of the second NMOS device MN2, and when a source voltage minimum value of the second NMOS device MN2 is 0 V, a drain voltage minimum value Vd_min of the second NMOS device MN2 is 0 V, that is, 0 V is a first minimum value of the node B. Therefore, the first node voltage of the node B is represented as B(0 V, 3.3 V).

Then a second node voltage A(0 V, 7 V) of the node A and a second node voltage C(0 V, 3.3 V) of the node C can be further calculated according to a conduction path of the to-be-tested circuit 22, the power voltage Vdd (7 V), the ground voltage GND (0 V), and the gate voltage PG (7 V), and the first node voltage B(0 V, 3.3 V) of the node B. Finally, these obtained second node voltage A(0 V, 7 V), the first node voltage B(0 V, 3.3 V), and the second node voltage C(0 V, 3.3 V) are applied to a circuit static check item related to a node voltage and a device voltage, to perform circuit static check on the to-be-tested circuit 22.

Because the second NMOS device MN2 is a transistor device working at 3.3 V, the obtained voltage range (0 V, 3.3 V) of the node B and the node C is within a working voltage range of the second NMOS device MN2, so that the second NMOS device MN2 can pass device voltage check successfully.

However, if a DC path adopted in the related art is used as a transfer path and the gate voltage is not considered, referring to FIG. 6, when the first PMOS device MP1, the first NMOS device MN1, and the second NMOS device MN2 are all turned on, as affected by the power voltage Vdd (7 V), node voltages of a node A', a node B', and a node C' are all (0 V, 7 V). The voltage range (0 V, 7 V) of the node B' and the node C' significantly exceeds the working voltage range (3.3 V) of the second NMOS device MN2. Consequently, in subsequent circuit static check, an erroneous warning that the second NMOS device MN2 fails in the voltage check is caused. However, by using the method provided in the present invention, erroneous warnings, caused by erroneous voltage transfer, of abnormal device use during check can be reduced for devices normally used.

Figure 7:
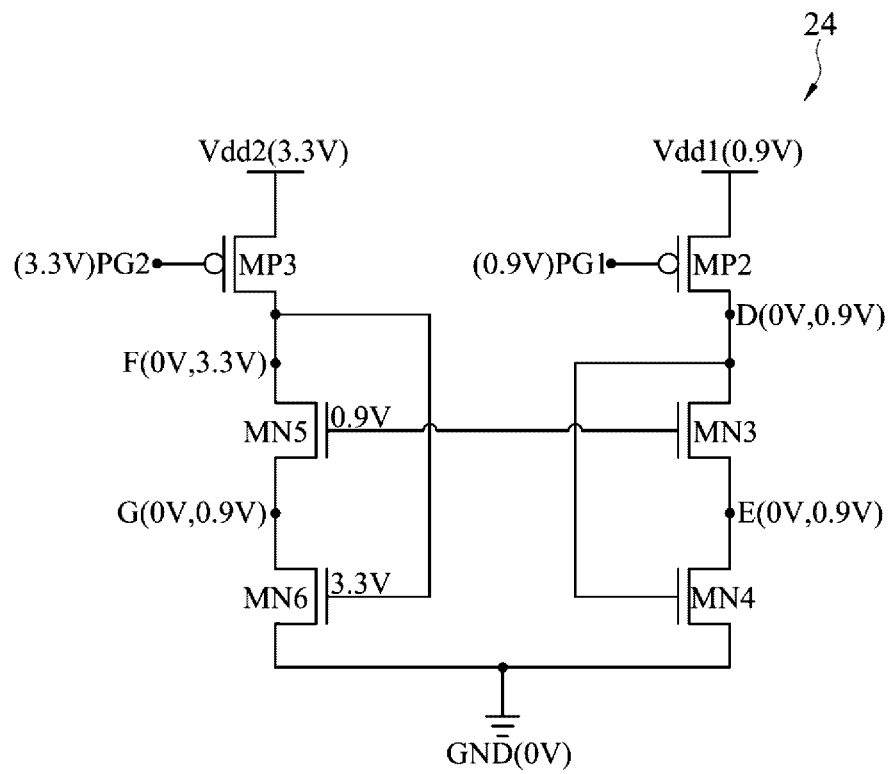
FIG. 7 is a schematic circuit diagram of another embodiment of a to-be-tested circuit to which the present invention is applied.

FIG. 7 is a schematic circuit diagram of another embodiment of a to-be-tested circuit to which the present invention is applied. Referring to FIG. 1 to FIG. 3 and FIG. 7, a to-be-tested circuit 24 includes six MOS devices: a second PMOS device MP2, a third NMOS device MN3, a fourth NMOS device MN4, a third PMOS device MP3, a fifth NMOS device MN5, and a sixth NMOS device MN6. A node D is present between the second PMOS device MP2 and the third NMOS device MN3, a node E is present between the third NMOS device MN3 and the fourth NMOS device MN4, a node F is present between the third PMOS device MP3 and the fifth NMOS device MN5, and a node G is present between the fifth NMOS device MN5 and the sixth NMOS device MN6. The node G is a first node, and the node D, the node E, and the node F are second nodes.

Endpoint voltages of input interface ports of the to-be-tested circuit 24 are set first: a power voltage Vdd1 is set to 0.9 V, a power voltage Vdd2 is set to 3.3 V, a ground voltage GND is set to 0 V, a gate voltage PG1 is set to 0.9 V, and a gate voltage PG2 is set to 3.3 V. The second PMOS device MP2, the third NMOS device MN3, the fourth NMOS device MN4, the third PMOS device MP3, the fifth NMOS device MN5, and the sixth NMOS device MN6 are all turned on, a first node voltage of the node G as the first node is first obtained through analysis. The node G is located at a source end of the fifth NMOS device MN5, and a source voltage maximum value Vs_max of the fifth NMOS device MN5 is a smaller one in a gate voltage maximum value 0.9 V and a drain voltage maximum value 3.3 V, that is, 0.9 V is selected as a first maximum value of the node G. The node G is located at a drain end of the sixth NMOS device MN6, and when a source voltage minimum value of the sixth NMOS device MN6 is 0 V, a drain voltage minimum value Vd_min of the sixth NMOS device MN6 is 0 V, that is, 0 V is a first minimum value of the node G. Therefore, the first node voltage of the node G is represented as G(0 V, 0.9 V).

Then a second node voltage D(0 V, 0.9 V) of the node D, a second node voltage E(0 V, 0.9 V) of the node E, and a second node voltage F(0 V, 3.3 V) of the node F are further obtained through analysis according to a conduction path of the to-be-tested circuit 24, the power voltage Vdd1 (0.9 V), the power voltage Vdd2 (3.3 V), the ground voltage GND(0 V), the gate voltage PG1 (0.9 V), the gate voltage PG2 (3.3 V), and the first node voltage G(0 V, 0.9 V) of the node G. Finally, these obtained first node voltage G(0 V, 0.9 V), the second node voltage D(0 V, 0.9 V), the second node voltage E(0 V, 0.9 V), and the second node voltage F(0 V, 3.3 V) are applied to a circuit check item related to a node voltage and a device voltage, to perform circuit static check on the to-be-tested circuit 24.

It can be learned from the circuit static check that, the sixth NMOS device MN6 violates a voltage check rule, that is, a drain voltage (0.9 V) and a gate voltage (3.3 V) of the sixth NMOS device MN6 are inconsistent. This problem is notified to a user so that the user may notice the problem of the sixth NMOS device MN6 and further deal with it.

Figure 8:
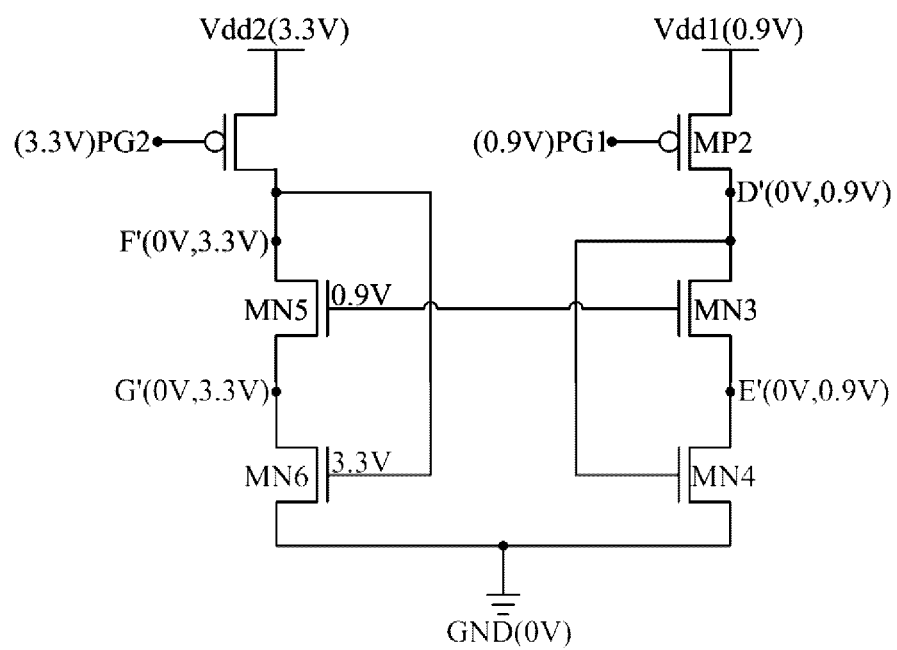
FIG. 8 is a schematic circuit diagram of another embodiment of a to-be-tested circuit without considering a gate voltage.

However, if a DC path adopted in the related art is used as a transfer path and the gate voltage is not considered, referring to FIG. 8, when the second PMOS device MP2, the third NMOS device MN3, the fourth NMOS device MN4, the third PMOS device MP3, the fifth NMOS device MN5, and the sixth NMOS device MN6 are all turned on, as affected by the power voltage Vdd1 (0.9 V) and the power voltage Vdd2 (3.3 V), node voltages of a node D' and a node E' are both (0 V, 0.9 V), and node voltages of a node F' and a node G' are both (0 V, 3.3 V). In this case, the drain voltage (3.3 V) and the gate voltage (3.3 V) of the sixth NMOS device MN6 are consistent. Consequently, in subsequent circuit static check, the sixth NMOS device MN6 conforms to the circuit check rule, and the actual problem of the sixth NMOS device MN6 cannot be found. However, by using the method provided in the present invention, an abnormal device can be accurately returned to avoid risk of omission caused by erroneous voltage transfer.

Furthermore, when the circuit is checked in the present invention, all the transistor devices in the to-be-tested circuit are turned on and a voltage of each node is calculated, so that whether a transistor device connected to the node is turned on can be further determined based on the voltage of the node. An output of a transistor device that is not turned on is regarded as a break point in voltage transfer to avoid a fact that a voltage passing through the transistor device that is not turned on leads to an erroneous voltage analysis result. In addition, the transistor device that is not turned on can be ignored and not checked, to reduce return errors of check results.

In conclusion, when a signal request is scheduled in the present invention, the gate voltage can be considered in the present invention to obtain node voltages for proper operation of the circuit, to find an abnormal device more accurately and avoid risk of misinformation (misjudgment) caused by erroneous voltage transfer.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A circuit check method, applicable to a to-be-tested circuit, wherein the to-be-tested circuit comprises at least one first node related to a gate voltage of at least one transistor device and a plurality of second nodes, and the circuit check method comprises:
   setting endpoint voltages of a plurality of input interface ports of the to-be-tested circuit;
   obtaining a first node voltage of the first node according to a conduction path of the to-be-tested circuit and the gate voltage of the transistor device, wherein the first node voltage comprises a first maximum value and a first minimum value of the first node;
   obtaining a second node voltage of each second node through analysis according to the conduction path, the endpoint voltages, and the first node voltage; and
   performing circuit static check on the to-be-tested circuit by applying the first node voltage and the second node voltage;
   wherein the transistor device is one of an N-type MOS (NMOS) device or a P-type MOS (PMOS) device;
   wherein when the transistor device is the N-type MOS (NMOS) device and in response to the NMOS device being turned on, a source voltage maximum value of the NMOS device is a smaller one in a gate voltage maximum value and a drain voltage maximum value of the NMOS device, and is taken as the first maximum value; and a drain voltage minimum value of the NMOS device is a source voltage minimum value, and is taken as the first minimum value; and
   wherein when the transistor device is the P-type MOS (PMOS) device and in response to the PMOS device being turned on, a drain voltage maximum value of the PMOS device is a source voltage maximum value, and is taken as the first maximum value; and a source voltage minimum value of the PMOS device is a larger one in a gate voltage minimum value and a drain voltage minimum value of the PMOS device, and is taken as the first minimum value.

2. The circuit check method according to claim 1, wherein the first node voltage considers voltage transfer of a gate and a source of the transistor device, or considers voltage transfer of the gate and a drain.

3. The circuit check method according to claim 1, wherein the first node voltage considers voltage transfer of a gate, a source, and a threshold voltage of the transistor device, or considers voltage transfer of the gate, a drain, and the threshold voltage.

4. The circuit check method according to claim 1, wherein the second node voltage comprises a second maximum value and a second minimum value of the second node.

5. An electronic apparatus, configured to check a to-be-tested circuit, wherein the to-be-tested circuit comprises at least one first node related to a gate voltage of at least one transistor device and a plurality of second nodes, the electronic apparatus performs a circuit check method on the to-be-tested circuit, and the circuit check method comprises:
   setting endpoint voltages of a plurality of input interface ports of the to-be-tested circuit;
   obtaining a first node voltage of the first node according to a conduction path of the to-be-tested circuit and the gate voltage of the transistor device, wherein the first node voltage comprises a first maximum value and a first minimum value of the first node;
   obtaining a second node voltage of each second node through analysis according to the conduction path, the endpoint voltages, and the first node voltage; and
   performing circuit static check on the to-be-tested circuit by applying the first node voltage and the second node voltage;
   wherein the transistor device is a metal oxide semiconductor (MOS) device, and the MOS device is an N-type MOS (NMOS) device, a P-type MOS (PMOS) device, or any combination of the NMOS device and the PMOS device;
   wherein when the MOS device is the NMOS device and is turned on, a source voltage maximum value of the NMOS device is a smaller one in a difference between a gate voltage maximum value and a threshold voltage and a drain voltage maximum value of the NMOS device, and is taken as the first maximum value; and a drain voltage minimum value of the NMOS device is a source voltage minimum value, and is taken as the first minimum value; and
   when the MOS device is the PMOS device and is turned on, a drain voltage maximum value of the PMOS device is a source voltage maximum value, and is taken as the first maximum value; and a source voltage minimum value of the PMOS device is a larger one in a difference between a gate voltage minimum value and a threshold voltage and a drain voltage minimum value of the PMOS device, and is taken as the first minimum value.

6. The electronic apparatus according to claim 5, wherein the first node voltage considers voltage transfer of a gate and a source of the transistor device, or considers voltage transfer of the gate and a drain.

7. The electronic apparatus according to claim 5, wherein the first node voltage considers voltage transfer of a gate, a source, and a threshold voltage of the transistor device, or considers voltage transfer of the gate, a drain, and the threshold voltage.

8. The electronic apparatus according to claim 5, wherein the second node voltage comprises a second maximum value and a second minimum value of the second node.

* * * * *